(12) United States Patent
Menke

(10) Patent No.: US 7,417,511 B2
(45) Date of Patent: Aug. 26, 2008

(54) MODULATION CIRCUIT WITH INTEGRATED MICROELECTRO-MECHANICAL SYSTEM (MEMS) COMPONENTS

(75) Inventor: Robert Allan Menke, Georgetown, KY (US)

(73) Assignee: Lexmark International, Inc., Lexington, KY (US)

( * ) Notice: Subject to any disclaimer, the term of this patent is extended or adjusted under 35 U.S.C. 154(b) by 79 days.

(21) Appl. No.: 11/010,551

(22) Filed: Dec. 13, 2004

(65) Prior Publication Data

US 2006/0139113 A1   Jun. 29, 2006

(51) Int. Cl.
*H03B 29/00* (2006.01)
(52) U.S. Cl. ............. 331/78; 331/177 V; 331/179; 331/181
(58) Field of Classification Search ........... 331/117 R, 331/117 FE, 117 D, 177 V, 179, 181, 78
See application file for complete search history.

(56) References Cited

U.S. PATENT DOCUMENTS

| | | | |
|---|---|---|---|
| 5,491,458 A * | 2/1996 | McCune et al. | 332/144 |
| 6,094,102 A | 7/2000 | Chang et al. | |
| 6,184,755 B1 * | 2/2001 | Barber et al. | 331/181 |
| 6,232,847 B1 | 5/2001 | Marcy, 5th et al. | |
| 6,242,989 B1 * | 6/2001 | Barber et al. | 331/177 V |
| 6,658,043 B2 | 12/2003 | Hardin et al. | |
| 6,711,216 B2 | 3/2004 | Hannah | |
| 2003/0081653 A1 | 5/2003 | Hardin et al. | |
| 2003/0210101 A1 | 11/2003 | McCorquodale et al. | |
| 2004/0012451 A1 | 1/2004 | Eckl et al. | |
| 2004/0113709 A1 | 6/2004 | Sibrai et al. | |
| 2004/0136440 A1 | 7/2004 | Miyata et al. | |
| 2004/0213324 A1 | 10/2004 | Hall et al. | |
| 2006/0152111 A1 * | 7/2006 | Allison et al. | 310/328 |

FOREIGN PATENT DOCUMENTS

WO   2006/033874   *   9/2004

OTHER PUBLICATIONS

Mansour, R. R. et al.; "RF MEMS Devices"; Proceedings of ICMENS2003; Jul. 20-23, 2003; 5 pages.*
Virgil Leenerts, "The Tuned Circuit LC Phase Modulator", WØINK, Mar. 8, 2005, p. 1, http://www.scomcontrollers.com/downloads/lcphasemod.pdf.
Altug Oz and Gary K. Fedder, "RF CMOS-MEMS Capacitor Having Large Tuning Range," The Robotics Institute MEMS Laboratory, Carnegie Mellon University, Transducers '03 (Boston), pp. 851-854, (Jun. 13, 2003). IEEE ICSSSAM.
T.K. Tsang and M.N. El-Gamal, W.S. Best, H.J. De Los Santos, "Wide Tuning Range RF-MEMS Varactors Fabricated Using the Polymumps Foundry," Reprinted in 2003 by Horizon House Pub., Inc. (7 pgs.), (Aug. 13, 2003).

(Continued)

*Primary Examiner*—David Mis
(74) *Attorney, Agent, or Firm*—Ronald K. Aust

(57) ABSTRACT

A modulation circuit includes a microelectronic electromechanical system (MEMS) based resonant structure having a resonant frequency, an excitation input and an output. A control module is coupled to the excitation input of the MEMS based resonant structure. The control module modifies resonant characteristics of the MEMS based resonant structure to modulate the resonant frequency of the MEMS based resonant structure to produce a modulated signal at the output.

21 Claims, 3 Drawing Sheets

OTHER PUBLICATIONS

Nils Hoivik, M.A. Michalicek, Y.C. Lee, K.C. Gupta and V.M. Bright, "Digitally Controllable Variable High-Q MEMS Capacitor for RF Applications," NSF Center for Advanced Manufact. and Pkg. of Microwave, Optical and Digital Elec. (University of CO), (4 pages). Jan. 2005.

Imed Zine-El-Abidine, Michal Okoniewski and John G. McRory, "A New Class of Tunable RF MEMS Inductors," Proceedings of the International Conference on MEMS, NANO and Smart Systems, (Dec. 13, 2003), (2 pages).

Didier Lacroix, "Getting Miniaturization (AKA MEMS) Accepted by OEMs," Point of View, p. 24, Dec. 18, 2003 Electronic Design.

* cited by examiner

MODULATION CIRCUIT WITH INTEGRATED MICROELECTRO-MECHANICAL SYSTEM (MEMS) COMPONENTS

BACKGROUND OF THE INVENTION

1. Field of the Invention

The present invention relates to signal generator circuits, and, more particularly, to a modulation circuit configured with integrated microelectro-mechanical system (MEMS) components.

2. Description of the Related Art

Modern electronic devices often use microprocessors or other digital circuits which require one or more clock signals for synchronization. For example, a clock signal permits the precise timing of events in the microprocessor. Typical microprocessors may be supervised or synchronized by a free-running oscillator, such as driven by a crystal, an LC-tuned circuit, or an external clock source. Over the years, clocking rates have continued to increase, and currently clock rates in personal computes may exceed 2.0 gigahertz (GHz). As clock rates increase, the circuits generating and processing the clock signals are susceptible to generating and radiating electromagnetic interference (EMI). The spectral components of the EMI emissions typically have peak amplitudes at harmonics of the fundamental frequency of the clock circuit.

In order to comply with such government limits on EMI emissions, spread spectrum clock generation (SSCG), such as that disclosed in U.S. Pat. No. 5,631,920, has been used to reduce EMI emissions. In summary, an SSCG circuit may include a clock pulse generator for generating a series of clock pulses, and a spread spectrum modulator for frequency modulating the clock pulse generator to broaden and flatten amplitudes of EMI spectral components which would otherwise be produced by the clock pulse generator. The spread spectrum modulator frequency modulates the clock pulses with specific profiles of frequency deviation versus the period of the profile. Currently, for example, the SSCG clock signal is generated on the system printed circuit board by either a discrete clock integrated circuit (IC), or by a phase lock loop (PLL) that is integrated into one or more application specific integrated circuits (ASICs).

SUMMARY OF THE INVENTION

The present invention provides a modulation circuit, such as for example, an SSCG, that is configured using integrated tunable micro electromechanical system (MEMS) components.

The invention, in one exemplary embodiment, is directed to a modulation circuit, including a microelectronic electromechanical system (MEMS) based resonant structure having a resonant frequency, an excitation input and an output. A control module is coupled to the excitation input of the MEMS based resonant structure. The control module modifies resonant characteristics of the MEMS based resonant structure to modulate the resonant frequency of the MEMS based resonant structure to produce a modulated signal at the output.

The invention, in another exemplary embodiment, is directed to a modulation circuit, including a microelectronic electromechanical system (MEMS) based resonant circuit having a resonant frequency and an output. A signal source is coupled to the MEMS based resonant circuit. The signal source applies an excitation signal to the MEMS based resonant circuit to modulate the resonant frequency of the MEMS based resonant circuit to produce a modulated signal at the output.

The invention, in another exemplary embodiment, is directed to a spread spectrum clock generation (SSCG) circuit including a MEMS based circuit having an output for supplying a spread spectrum clocking signal.

The invention, in another exemplary embodiment, is directed to a spread spectrum clock generation (SSCG) circuit. The SSCG circuit includes a resonant circuit having a resonant frequency and an output. The resonant circuit is formed using at least one microelectronic electromechanical system (MEMS) component. A device is coupled to the at least one MEMS component. The device applies an excitation signal to the at least one MEMS component to modulate the resonant frequency of the resonant circuit to produce a spread spectrum clocking signal at the output having a predetermined period and a predetermined frequency deviation profile.

An advantage of the present invention is using MEMS technology in an SSCG system provides lower system cost by reducing the number of parts required on a system printed circuit board.

Another advantage is that using MEMs technology may provide much higher clock frequencies than most current PLL circuits.

Another advantage of MEMs component usage, such as in a SSCG, is the reduction of the application specific integrated circuit (ASIC) die space compared to similar circuits using other component technologies, thereby allowing a greater number of features to be integrated into the ASIC.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein.

Corresponding reference characters indicate corresponding parts throughout the several views. The exemplifications set out herein illustrate embodiments of the invention, and such exemplifications are not to be construed as limiting the scope of the invention in any manner.

DETAILED DESCRIPTION OF THE INVENTION

Figure 1:
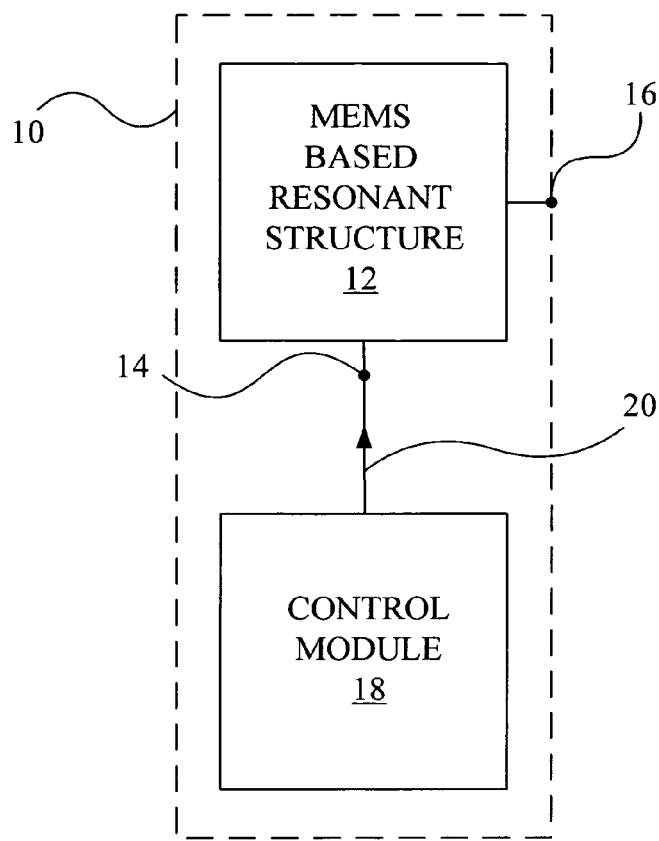
FIG. 1 is a block diagram of an embodiment of a modulation circuit in accordance with the present invention.

Referring now to the drawings and particularly to FIG. 1, there is shown an embodiment of a modulation circuit 10 in accordance with the present invention.

Modulation circuit 10 includes a microelectronic electromechanical system (MEMS) based resonant structure 12 having a resonant frequency, an excitation input 14 and an output 16. The MEMS based resonant structure 12 is formed using at least one MEMS component, an in some embodiments, may be configured using only MEMS components, or may be formed using a combination of one or more MEMS components and other discrete components fabricated using other technologies.

Modulation circuit 10 further includes a control module 18. Control module 18 modifies the resonant characteristics of MEMS based resonant structure 12 to modulate the resonant frequency of MEMS based resonant structure 12 to produce a modulated signal at output 16. Control module 18 is coupled via a communications link 20 to excitation input 14 of MEMS based resonant structure 12.

In the various embodiments of the present invention, communications link 20 may provide a mechanical coupling or an electrical coupling of control module 18 to MEMS based resonant structure 12. Accordingly, excitation input 14 receives from control module 18 an excitation signal, wherein the excitation signal may be a mechanical excitation or an electrical excitation, depending upon the configuration of MEMS based resonant structure 12 and the type of coupling provided by communications link 20. In its simplest form, for example, where communications link 20 provides a mechanical coupling, communications link 20 may represent a direct mechanical attachment of control module 18 to MEMS based resonant structure 12. Where communications link 20 provides an electrical coupling, for example, communications link 20 may represent single or multiple conductors providing electrical attachment of control module 18 to MEMS based resonant structure 12, which in turn may carry one or more analog or digital signals.

In one embodiment, for example, control module 18 serves as a signal source to provide an excitation signal to excitation input 14 of MEMS based resonant structure 12, and more particularly, may be coupled to at least one MEMS component in MEMS based resonant structure 12. Control module 18 applies the excitation signal, such as a periodic signal, to MEMS based resonant structure 12 to modulate the resonant frequency of MEMS based resonant structure 12 to produce a modulated signal at output 16.

Figure 2:
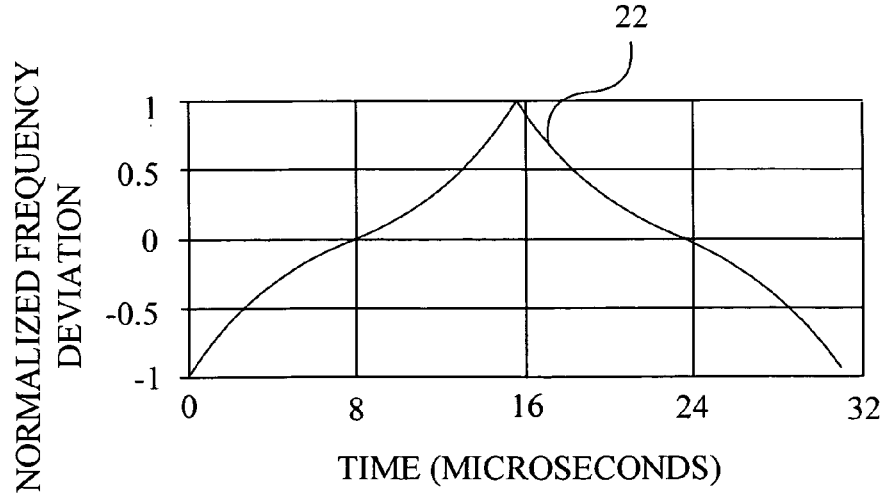
FIG. 2 is a graph illustrating an exemplary embodiment of a profile of a periodic signal that may be produced by a signal source of the modulation circuit of FIG. 1.

FIG. 2 shows a graph illustrating an exemplary embodiment of a profile 22 of a modulated signal at output 16 that may be produced by application of the excitation signal supplied by control module 18 to MEMS based resonant structure 12. In this example, profile 22 may be used for producing a spread spectrum modulated output signal at output 16. The frequency modulation of the resonant frequency of MEMS based resonant structure 12 with the excitation signal supplied by control module 18 results in the modulated signal at output 16 having profile 22, which reduces the spectral amplitude of the EMI components at each harmonic of the of the resonant frequency of MEMS based resonant structure 12 when compared to the spectrum of the same resonant frequency without modulation. Accordingly, in this example, modulation circuit 10 is a spread spectrum clock generation (SSCG) circuit and the output signal at output 16 is a spread spectrum clock signal suitable for use, for example, in an imaging machine (e.g., printer, all-in-one, copier, etc.) and computer applications.

The graph of FIG. 2 illustrates profile 22 as normalized frequency deviation versus time. In this example, the maximum deviation is illustrated as one unit, and is typically represented as a percentage of the base clock frequency. In this example, the frequency of the signal modulating the profile is 30 kHz. This maximum frequency deviation is desirably programmable with an upper limit of the maximum deviation being dependent, for example, on the application. For example, the upper limit of the maximum deviation may be in the range of about 0.1 percent to 5.0 percent, or higher, depending on the application, as would be readily understood by those skilled in the art. As would be also readily understood by those skilled in the art, a standard, non-modulated clock signal corresponding to the resonant frequency of MEMS based resonant structure 12 may be obtained by programming the maximum deviation to 0. In addition, those skilled in the art will recognize the shape of the profile may be varied from that of profile 22, if desired. For example, by varying the amount of inflection of the profile 22, a triangular or sinusoidal profile may be generated. Another example would be linear combinations of various profiles.

Figure 3:
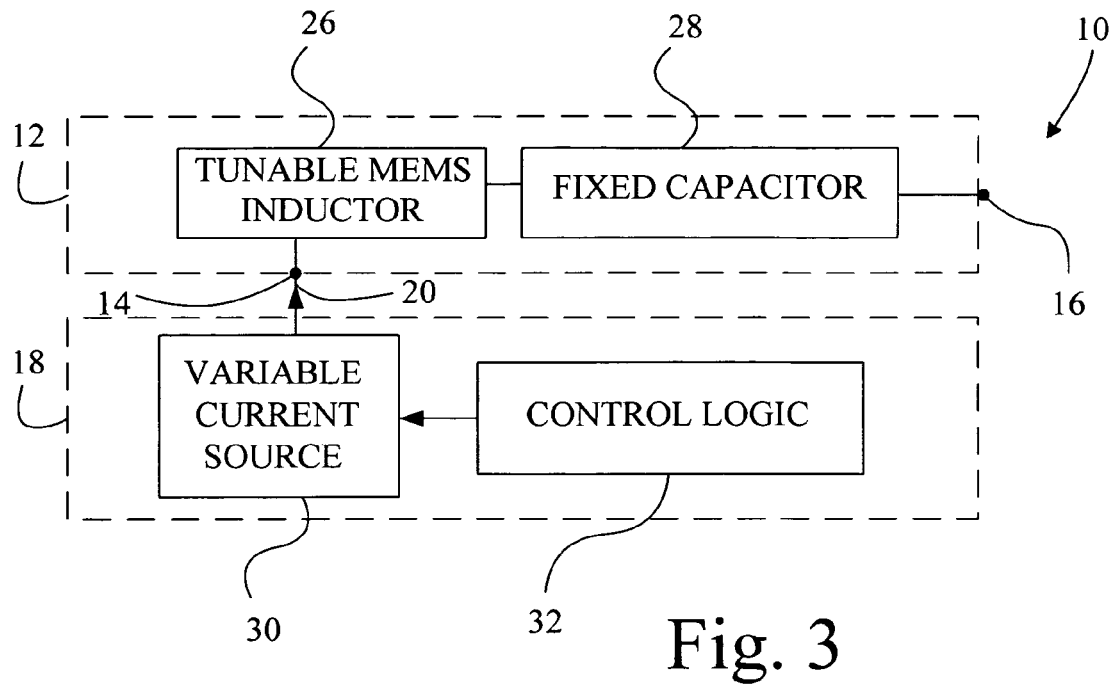
FIG. 3 is a block diagram of one embodiment of the modulation circuit of FIG. 1.

FIG. 3 is a block diagram of one embodiment of modulation circuit 10, including MEMS based resonant structure 12 and control module 18. In this embodiment, MEMS based resonant structure 12 includes a tunable MEMS inductor 26 and a fixed capacitor 28, which combine to form a MEMS based resonant tank circuit. Fixed capacitor 28 may be a MEMS capacitor or a standard discrete capacitor. Control module 18 may include, for example, a variable current source 30 and control logic 32. Variable current source 30 supplies a modulation signal to excitation input 14, which is an input to tunable MEMS inductor 26. Control logic 32 is used to select the profile, such as for example the profile 22 shown in FIG. 2, of a modulated signal produced at output 16. In this example, profile 22 may be used for producing a spread spectrum modulated output signal at output 16. Control logic 32 may include, for example, a lookup table to determine the current settings associated with the modulation signal supplied to excitation input 14 to control the modulation of MEMS based resonant structure 12.

Figure 4:
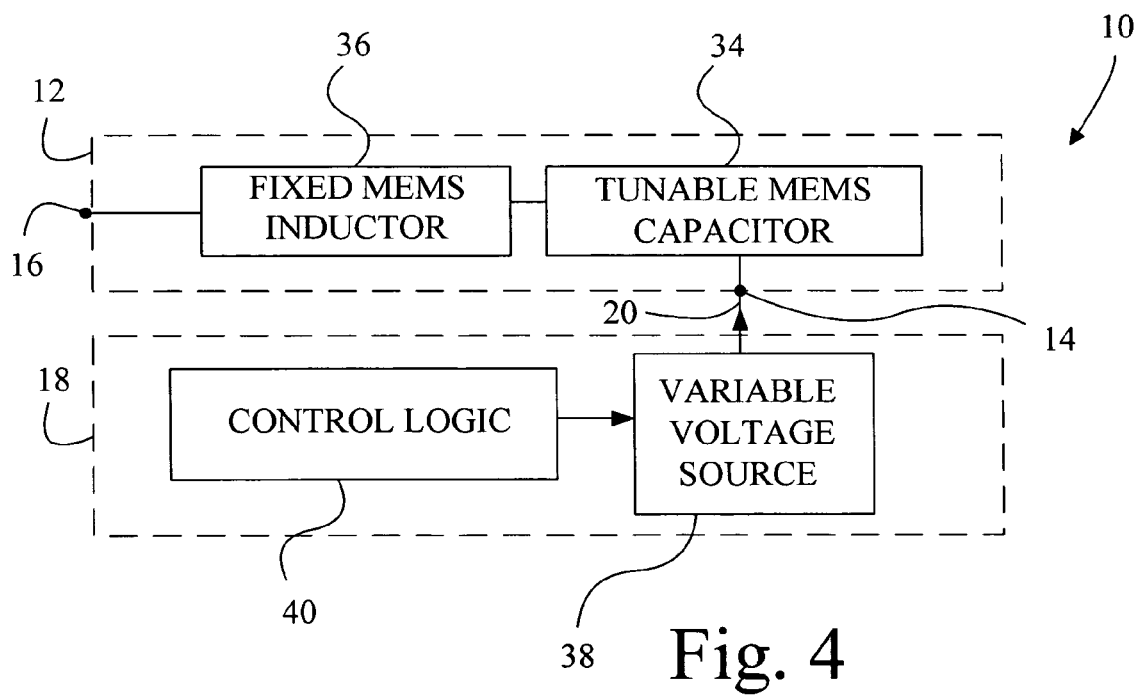
FIG. 4 is a block diagram of another embodiment of the modulation circuit of FIG. 1.

FIG. 4 is another embodiment of modulation circuit 10, including MEMS based resonant structure 12 and control module 18. In this embodiment, MEMS based resonant structure 12 includes a tunable MEMS capacitor 34 and a fixed MEMS inductor 36, which combine to form a MEMS based resonant tank circuit. Control module 18 may include, for example, a variable voltage source 38 and control logic 40. Variable current source 30 supplies a modulation signal to excitation input 14, which is an input to tunable MEMS capacitor 34. Control logic 40 is used to select the profile, such as for example the profile 22 shown in FIG. 2, of a signal that may be produced at output 16. In this example, profile 22 may be used for producing a spread spectrum modulated output signal at output 16. Control logic 40 may include, for example, a lookup table to determine the voltage settings associated with the modulation signal supplied to excitation input 14 to control the modulation of MEMS based resonant structure 12.

Figure 5:
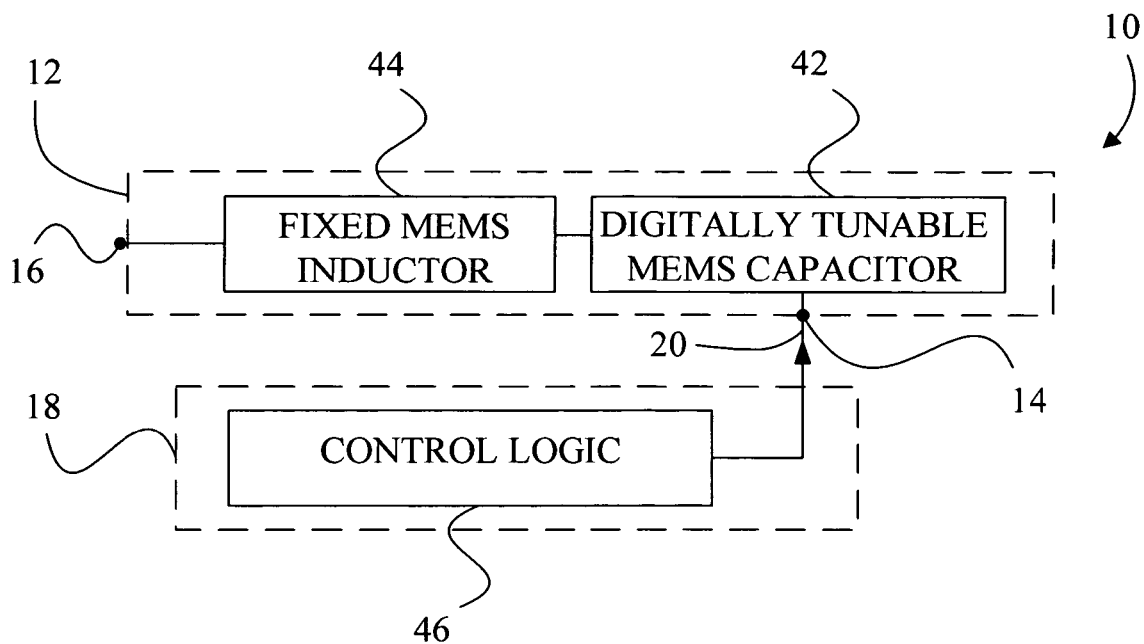
FIG. 5 is a block diagram of another embodiment of the modulation circuit of FIG. 1.

FIG. 5 is another embodiment of modulation circuit 10, including MEMS based resonant structure 12 and control module 18. In this embodiment, MEMS based resonant structure 12 includes a digitally tunable MEMS capacitor 42 and a fixed MEMS inductor 44, which combine to form a MEMS based resonant tank circuit. Digitally tunable MEMS capacitor 42 has a plurality of capacitive components which may be selectively enabled or disabled to select the amount of desired capacitance. Control module 18 includes control logic 46, which supplies one or more digital signals to excitation input 14, which in this embodiment is an input to digitally tunable MEMS capacitor 42. Control logic 46 is used to select the profile, such as for example the profile 22 shown in FIG. 2, that may be produced at output 16. In this example, profile 22 may be used for producing a spread spectrum modulated output signal at output 16. Control logic 46 may include, for example, a processor and a lookup table to determine the pulse sequence associated with the excitation signal supplied to excitation input 14 to control the modulation of MEMS based resonant structure 12.

Figure 6:
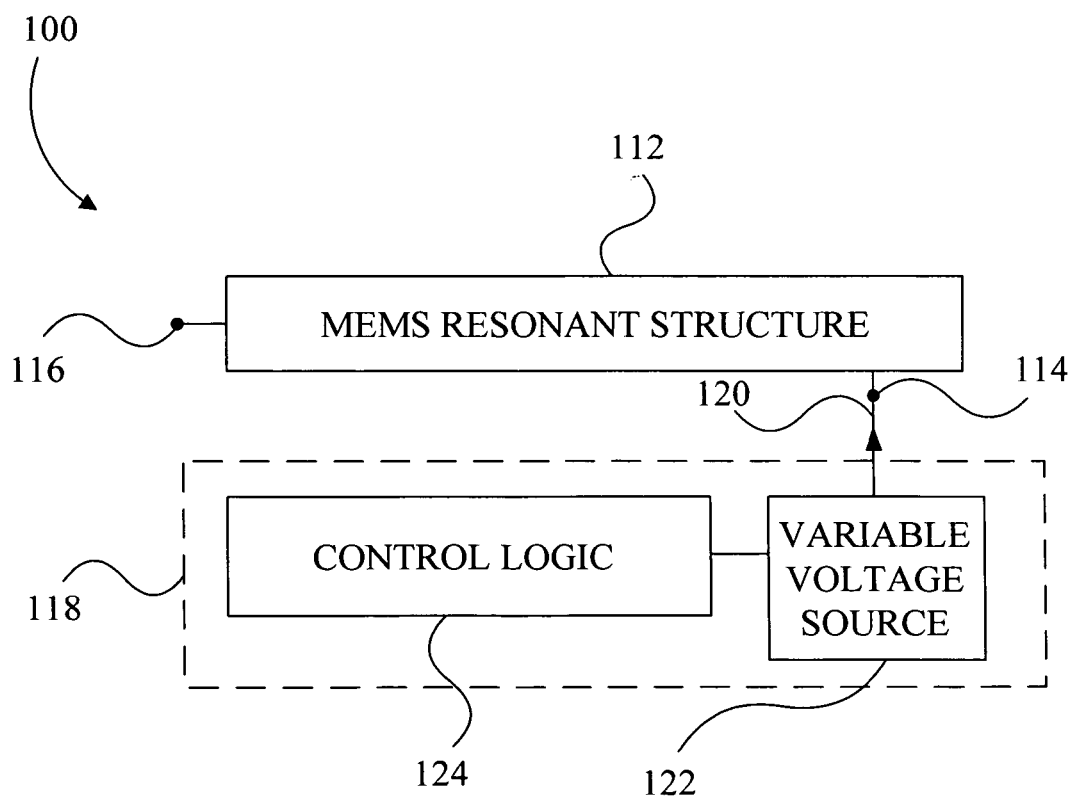
FIG. 6 is a block diagram of a modulation circuit in accordance with another embodiment of the present invention.

In FIG. 6 there is shown a modulation circuit 100 in accordance with another embodiment of the present invention. Modulation circuit 100 includes a MEMS resonant structure 112 having a resonant frequency, an excitation input 114 and an output 116. Modulation circuit 100 further includes a control module 118. Control module 118 is coupled via a communications link 120, such as for example mechanically, to excitation input 114 of MEMS resonant structure 112. Control module 118 may include, for example, a variable voltage source 122 and control logic 124. Variable voltage source 122 supplies an excitation signal, such as a modulation signal, to excitation input 114 of MEMS resonant structure 112. Control logic 124 is used to select the profile, such as for example the profile 22 shown in FIG. 2, of a signal that may be produced at output 116. In this example, profile 22 may be used for producing a spread spectrum modulated output signal at output 116. Control logic 124 may include, for example, a lookup table to determine the voltage settings associated with the excitation signal supplied to excitation input 114 to control the modulation of MEMS resonant structure 112.

In the various embodiments described above, the output frequency of the output signals present at outputs 16, 116 of each of modulation circuits 10, 100, respectively, is tightly controlled, and this control provides the ability to modulate the output frequency to possess a specific profile, such as an SSCG frequency profile, similar to that shown for example in FIG. 2, although other profiles may be supported. The output then achieves EMI reduction when used in an electronic system, such as an imaging system or a computer system.

The equations describing the resonant behavior of a MEMS based resonant structure is typically determined through numerical analysis, as is known in the art. Thus, for applications where table values in a lookup table are used to control the modulation of the MEMS based resonant structure, these table values may be determined through similar numerical analysis, or through experimental feedback and simulation.

While the modulation circuits 10, 100 have been described with respect to examples of EMI reduction, those skilled in the art will recognize that the principles of the present invention may be applied to other technological endeavors, such as for example, providing modulation circuits for analog and digital communication techniques.

While this invention has been described with respect to embodiments of the invention, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A spread spectrum clock generation (SSCG) circuit comprising a MEMS based circuit having a plurality of circuit components configured to generate a spread spectrum clocking signal based on a modulation of a resonant frequency of said MEMS based circuit and an output coupled to at least one of said circuit components to supply said spread spectrum clocking signal.

2. The SSCG circuit of claim 1, further comprising a signal source coupled to said MEMS based circuit, said signal source applying an input signal to said MEMS based circuit to modulate said resonant frequency of said MEMS based circuit to produce said spread spectrum clocking signal at said output having a predetermined period and a predetermined frequency deviation profile.

3. The SSCG circuit of claim 2, wherein said MEMS based circuit is a resonant tank circuit including a tunable MEMS inductor and a fixed capacitor, said input signal being connected to said tunable MEMS inductor.

4. The SSCG circuit of claim 2, wherein said MEMS based circuit is a resonant tank circuit including a tunable MEMS capacitor and a fixed MEMS inductor, said input signal being connected to said tunable MEMS capacitor.

5. The SSCG circuit of claim 2, wherein said MEMS based circuit is a resonant tank circuit including a digitally tunable MEMS capacitor and a fixed MEMS inductor, said input signal being connected to said digitally tunable MEMS capacitor.

6. A spread spectrum clock generation (SSCG) circuit, comprising:
   a resonant circuit having a resonant frequency and an output, said resonant circuit being formed using at least one microelectronic electromechanical system (MEMS) component; and
   a device coupled to said at least one MEMS component, said device applying an excitation signal to said at least one MEMS component to modulate said resonant frequency of said resonant circuit to produce a spread spectrum clocking signal at said output having a predetermined period and a predetermined frequency deviation profile.

7. The SSCG circuit of claim 6, wherein said resonant circuit is a resonant tank circuit including a tunable MEMS inductor and a fixed capacitor, said excitation signal being connected to said tunable MEMS inductor.

8. The SSCG circuit of claim 6, wherein said resonant circuit is a resonant tank circuit including a tunable MEMS capacitor and a fixed MEMS inductor, said excitation signal being connected to said tunable MEMS capacitor.

9. The SSCG circuit of claim 6, wherein said resonant circuit is a resonant tank circuit including a digitally tunable MEMS capacitor and a fixed MEMS inductor, said excitation signal being connected to said tunable MEMS capacitor.

10. A spread spectrum clock generation (SSCG) circuit, comprising:
    a microelectronic electromechanical system (MEMS) based resonant structure having a resonant frequency, an excitation input and an output; and
    a control module coupled to said excitation input of said MEMS based resonant structure, said control module modifying resonant characteristics of said MEMS based resonant structure to modulate said resonant frequency of said MEMS based resonant structure to produce a modulated signal at said output.

11. The SSCG circuit of claim 10 wherein said excitation input receives from said control module an excitation signal, said excitation signal being periodic and at least one of a mechanical excitation and an electrical excitation.

12. The SSCG circuit of claim 10 wherein said modulated signal has a predetermined period and a predetermined frequency deviation profile.

13. The SSCG circuit of claim 10, wherein said resonant structure comprises a resonant tank circuit including a tunable MEMS inductor and a fixed capacitor, said excitation input being connected to said tunable MEMS inductor.

14. The SSCG circuit of claim 10, wherein said resonant structure comprises a resonant tank circuit including a tunable MEMS capacitor and a fixed MEMS inductor, said excitation input being connected to said tunable MEMS capacitor.

15. The SSCG circuit of claim 14, wherein said tunable MEMS capacitor comprises a digitally tunable MEMS capacitor.

16. A spread spectrum clock generation (SSCG) circuit, comprising:
a microelectronic electromechanical system (MEMS) based resonant circuit having a resonant frequency and an output; and
a signal source coupled to said MEMS based resonant circuit, said signal source applying an excitation signal to said MEMS based resonant circuit to modulate said resonant frequency of said MEMS based resonant circuit to produce a modulated signal at said output.

17. The SSCG circuit of claim 16 wherein said excitation signal is periodic and at least one of a mechanical excitation and an electrical excitation.

18. The SSCG circuit of claim 16 wherein said modulated signal has a predetermined period and a predetermined frequency deviation profile.

19. The SSCG circuit of claim 16, wherein said resonant circuit comprises a resonant tank circuit including a tunable MEMS inductor and a fixed capacitor, said excitation signal being connected to said tunable MEMS inductor.

20. The SSCG circuit of claim 16, wherein said resonant circuit comprises a resonant tank circuit including a tunable MEMS capacitor and a fixed MEMS inductor, said excitation signal being connected to said tunable MEMS capacitor.

21. The SSCG circuit of claim 16, wherein said resonant circuit comprises a resonant tank circuit including a digitally tunable MEMS capacitor and a fixed MEMS inductor, said excitation signal being connected to said digitally tunable MEMS capacitor.

* * * * *